(12) United States Patent
Ross et al.

(10) Patent No.: US 10,201,116 B1
(45) Date of Patent: Feb. 5, 2019

(54) COOLING SYSTEM FOR DATA CENTER RACK

(71) Applicant: Amazon Technologies, Inc., Reno, NV (US)

(72) Inventors: Peter George Ross, Olympia, WA (US); Matthew David Striffler, Papillion, NE (US); Alan Donald Gillooly, Auburn, WA (US)

(73) Assignee: Amazon Technologies, Inc., Reno, NV (US)

( * ) Notice: Subject to any disclaimer, the term of this patent is extended or adjusted under 35 U.S.C. 154(b) by 271 days.

(21) Appl. No.: 14/093,997

(22) Filed: Dec. 2, 2013

(51) Int. Cl.
*H05K 7/20* (2006.01)
*H05K 7/18* (2006.01)

(52) U.S. Cl.
CPC ........... *H05K 7/20836* (2013.01); *H05K 7/18* (2013.01)

(58) Field of Classification Search
CPC ... F28F 9/007; H05K 7/20781; Y10T 29/4935
USPC ........... 49/501, 505; 165/55, 67, 77, 104.14, 165/122; 312/272; 361/695, 724, 726; 454/184
See application file for complete search history.

(56) References Cited

U.S. PATENT DOCUMENTS

| | | | |
|---|---|---|---|
| 4,860,824 A * | 8/1989 | Foley | H05K 7/206 165/165 |
| 5,806,583 A * | 9/1998 | Suzuki | F28D 15/0233 165/104.14 |
| 6,131,647 A * | 10/2000 | Suzuki | H05K 7/20609 165/104.14 |
| 6,208,510 B1 * | 3/2001 | Trudeau | H05K 7/20609 165/80.3 |
| 6,628,520 B2 * | 9/2003 | Patel | H05K 7/20754 165/104.32 |
| 6,775,137 B2 * | 8/2004 | Chu | H05K 7/20754 165/120 |
| 6,896,612 B1 * | 5/2005 | Novotny | H05K 7/20618 361/691 |
| 6,909,606 B2 * | 6/2005 | Barsun | H05K 7/20736 165/104.33 |
| 7,187,549 B2 * | 3/2007 | Teneketges | H01L 23/473 165/104.33 |
| 7,397,661 B2 * | 7/2008 | Campbell | H05K 7/20754 165/104.33 |
| 7,430,118 B1 * | 9/2008 | Noteboom | H05K 7/20745 165/104.33 |

(Continued)

OTHER PUBLICATIONS

"Eliminating CRAG in the Data Center"; ISAC (Inside Server Air Conditioning); 2013; 2 pages.

*Primary Examiner* — Dion R Ferguson
*Assistant Examiner* — Amir Jalali
(74) *Attorney, Agent, or Firm* — Baker & Hostetler LLP

(57) ABSTRACT

A data center can include at least one computing room, and at least one rack system disposed in the computing room. The rack system includes a rack housing that at least substantially encapsulates an interior space, and a plurality of computing devices mounted to the rack in the interior space. The data center can further include a cooling system. The cooling system includes a conduit that is disposed in the interior space of the rack housing and a fluid that flows through the conduit, wherein heat is transferred from air in the interior space to the fluid to produce cooled air in the rack housing.

28 Claims, 5 Drawing Sheets

(56) References Cited

U.S. PATENT DOCUMENTS

| | | | | |
|---|---|---|---|---|
| 7,443,674 B1* | 10/2008 | Hanlon | H05K 7/20736 | 361/694 |
| 7,505,269 B1* | 3/2009 | Cosley | F28D 15/02 | 165/104.33 |
| 7,639,499 B1* | 12/2009 | Campbell | H05K 7/20772 | 165/104.19 |
| 7,751,188 B1* | 7/2010 | French | H05K 7/20736 | 165/104.33 |
| 7,751,191 B2* | 7/2010 | Kakikawa | H05K 7/20563 | 257/930 |
| 7,791,882 B2* | 9/2010 | Chu | H05K 7/20745 | 165/104.33 |
| 7,905,106 B2* | 3/2011 | Attlesey | G06F 1/20 | 165/104.33 |
| 7,907,402 B2* | 3/2011 | Caveney | H05K 7/20572 | 312/223.2 |
| 8,087,979 B2* | 1/2012 | Rasmussen | H05K 7/20572 | 361/695 |
| 8,248,793 B2* | 8/2012 | Bash | H05K 7/20609 | 312/236 |
| 8,425,287 B2* | 4/2013 | Wexler | H05K 7/20745 | 361/690 |
| 8,477,491 B1* | 7/2013 | Ross | H05K 7/20736 | 361/679.48 |
| 8,526,182 B2* | 9/2013 | Chen | H05K 7/20736 | 165/104.33 |
| 8,625,274 B2* | 1/2014 | Lin | G06F 1/206 | 361/679.46 |
| 8,675,357 B2* | 3/2014 | Namek | H05K 7/20745 | 181/202 |
| 8,720,532 B2* | 5/2014 | Malone | H05K 7/20727 | 165/121 |
| 8,964,391 B2* | 2/2015 | Campbell | H05K 7/20809 | 361/679.53 |
| 8,991,476 B2* | 3/2015 | Tsubone | F28D 20/0039 | 165/10 |
| 9,016,352 B2* | 4/2015 | Helbig | F28F 9/007 | 165/67 |
| 9,155,230 B2* | 10/2015 | Eriksen | H05K 7/20781 | |
| 2003/0002254 A1* | 1/2003 | Faneuf | H05K 7/20727 | 361/679.49 |
| 2003/0035264 A1* | 2/2003 | Hartel | H05K 7/20572 | 361/678 |
| 2004/0265662 A1* | 12/2004 | Brignone | H01M 8/04029 | 429/440 |
| 2005/0024826 A1* | 2/2005 | Bash | G06F 1/20 | 361/695 |
| 2005/0068728 A1* | 3/2005 | Chu | G06F 1/20 | 361/690 |
| 2006/0019597 A1* | 1/2006 | Beitelmal | H05K 7/20727 | 454/184 |
| 2006/0176665 A1* | 8/2006 | Matsushima | G06F 1/206 | 361/679.47 |
| 2006/0232945 A1* | 10/2006 | Chu | H05K 7/2079 | 361/724 |
| 2007/0030650 A1* | 2/2007 | Madara | H05K 7/20818 | 361/695 |
| 2007/0035928 A1* | 2/2007 | Hamman | G06F 1/20 | 361/701 |
| 2007/0125523 A1* | 6/2007 | Bhatti | G06F 1/20 | 165/104.33 |
| 2007/0163748 A1* | 7/2007 | Rasmussen | F16L 3/2235 | 165/53 |
| 2007/0167125 A1* | 7/2007 | Rasmussen | H05K 7/2079 | 454/184 |
| 2008/0037217 A1* | 2/2008 | Murakami | H05K 7/206 | 361/695 |
| 2008/0055846 A1* | 3/2008 | Clidaras | G06F 1/20 | 361/679.41 |
| 2008/0084664 A1* | 4/2008 | Campbell | G06F 1/20 | 361/699 |
| 2008/0232064 A1* | 9/2008 | Sato | H05K 7/20754 | 361/679.49 |
| 2009/0086428 A1* | 4/2009 | Campbell | H05K 7/2079 | 361/694 |
| 2009/0086434 A1* | 4/2009 | Hodes | H05K 7/20754 | 361/700 |
| 2009/0097205 A1* | 4/2009 | Matsushima | H05K 7/20736 | 361/700 |
| 2009/0152216 A1* | 6/2009 | Champion | G06F 1/183 | 211/26 |
| 2009/0161312 A1* | 6/2009 | Spearing | H05K 7/20727 | 361/679.47 |
| 2009/0225514 A1* | 9/2009 | Correa | H05K 7/20781 | 361/701 |
| 2009/0260384 A1* | 10/2009 | Champion | H05K 7/20754 | 62/259.2 |
| 2009/0262495 A1* | 10/2009 | Neudorfer | G06F 1/20 | 361/679.47 |
| 2009/0262501 A1* | 10/2009 | Claassen | G06F 1/20 | 361/701 |
| 2009/0310300 A1* | 12/2009 | Chrysler | H05K 7/20681 | 361/691 |
| 2010/0032140 A1* | 2/2010 | Copeland | H05K 7/20836 | 165/104.33 |
| 2010/0033931 A1* | 2/2010 | Miyazawa | H05K 7/20745 | 361/696 |
| 2010/0103614 A1* | 4/2010 | Campbell | H05K 7/20809 | 361/689 |
| 2010/0103618 A1* | 4/2010 | Campbell | H05K 7/20772 | 361/699 |
| 2010/0147490 A1* | 6/2010 | Campbell | H05K 7/2079 | 165/80.3 |
| 2010/0252234 A1* | 10/2010 | Cambell | H01L 23/473 | 165/80.2 |
| 2010/0307716 A1* | 12/2010 | Bean, Jr. | H05K 7/20745 | 165/80.2 |
| 2010/0317278 A1* | 12/2010 | Novick | H05K 7/20836 | 454/184 |
| 2011/0026225 A1* | 2/2011 | Ostwald | H05K 7/20781 | 361/699 |
| 2011/0063792 A1* | 3/2011 | Schmidt | G06F 1/20 | 361/679.46 |
| 2011/0128703 A1* | 6/2011 | Fujihara | G06F 1/20 | 361/697 |
| 2011/0303394 A1* | 12/2011 | Branton | H05K 7/20754 | 165/104.33 |
| 2012/0048514 A1* | 3/2012 | Osbaugh | H05K 7/20827 | 165/104.21 |
| 2012/0127655 A1* | 5/2012 | Tung | H05K 7/20781 | 361/679.47 |
| 2012/0138285 A1* | 6/2012 | Tsubaki | H05K 7/20781 | 165/293 |
| 2012/0205089 A1* | 8/2012 | Doerrich | H05K 7/20745 | 165/287 |
| 2013/0128455 A1* | 5/2013 | Koblenz | G05D 23/1917 | 361/692 |
| 2013/0278121 A1* | 10/2013 | Shimada | F24F 13/32 | 312/236 |
| 2014/0124164 A1* | 5/2014 | Campbell | H05K 7/2039 | 165/45 |
| 2014/0124174 A1* | 5/2014 | Campbell | F28F 3/048 | 165/104.31 |
| 2014/0124190 A1* | 5/2014 | Campbell | H05K 7/20781 | 165/296 |
| 2014/0126151 A1* | 5/2014 | Campbell | H05K 7/2079 | 361/699 |
| 2014/0146465 A1* | 5/2014 | Wei | H05K 7/20781 | 361/679.47 |
| 2015/0048950 A1* | 2/2015 | Zeighami | H05K 7/20781 | 340/605 |

* cited by examiner

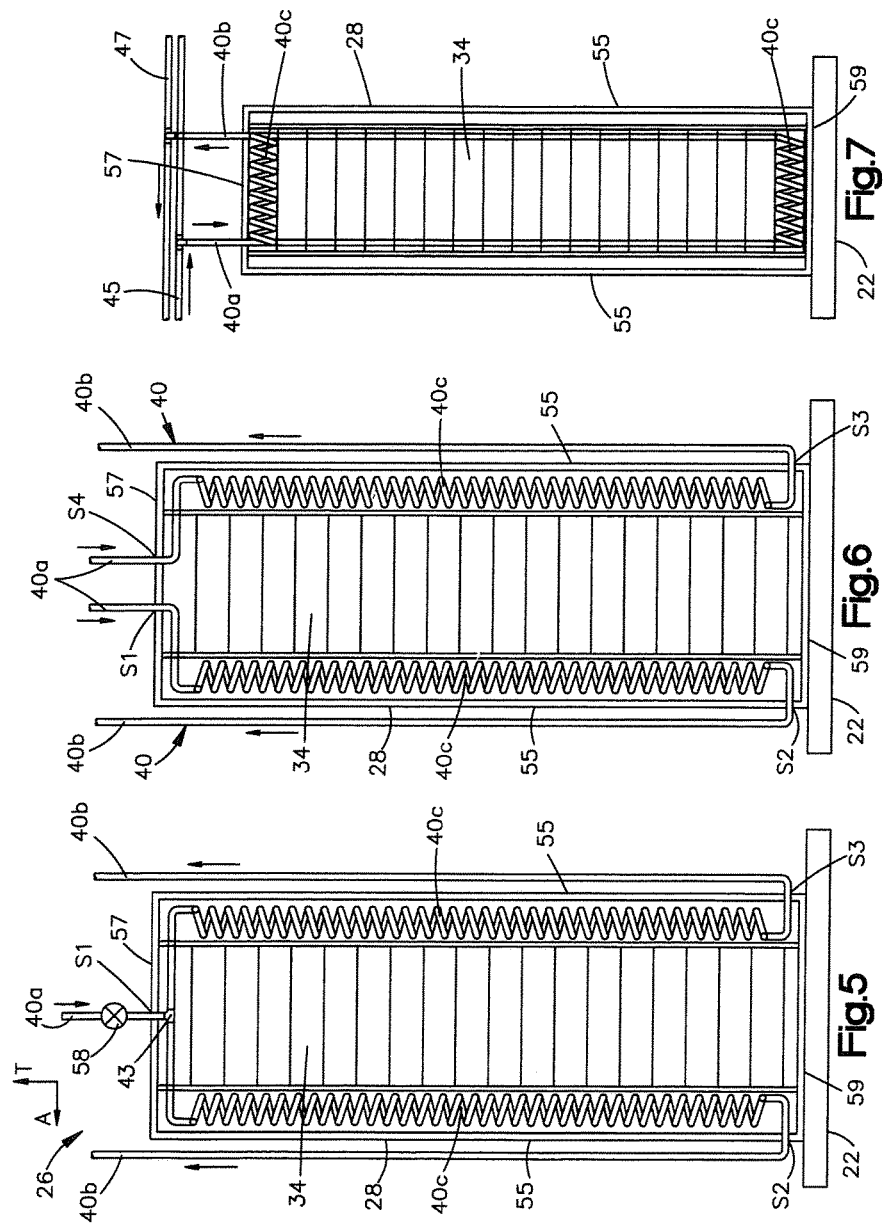

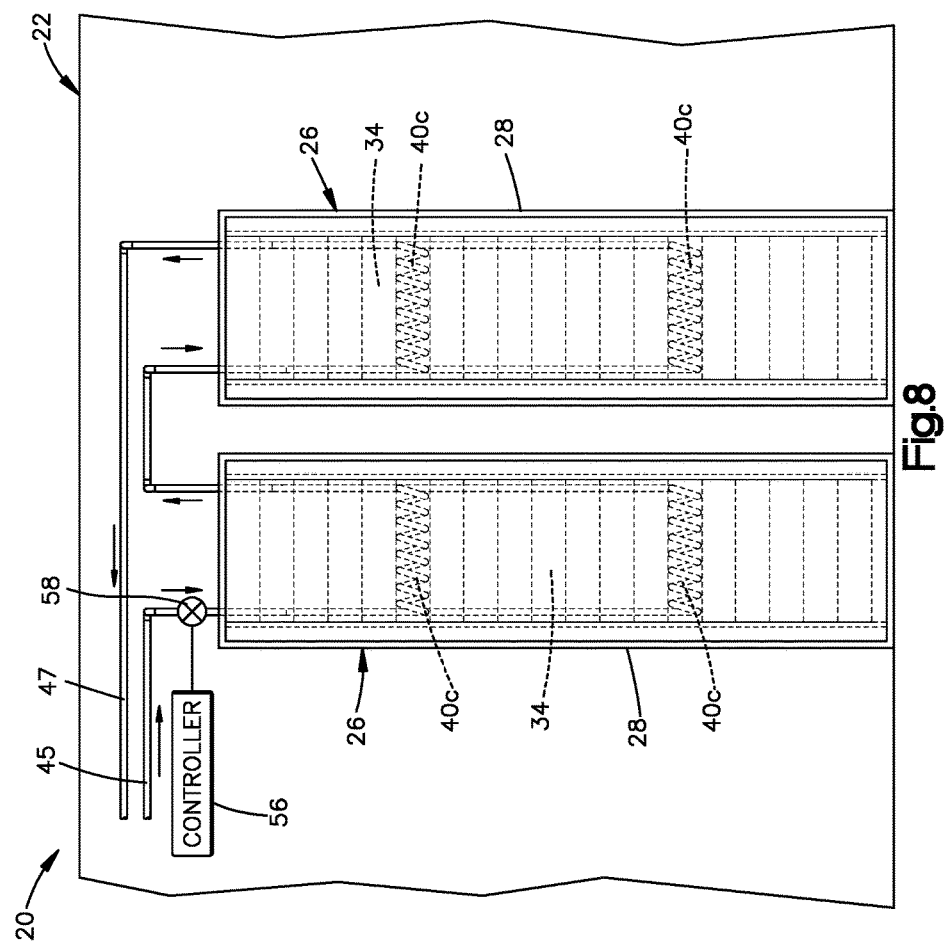

COOLING SYSTEM FOR DATA CENTER RACK

BACKGROUND

Computing-intensive or data-intensive organizations such as on-line retailers, Internet service providers, search providers, financial institutions, and the like often conduct computer operations from large scale computing facilities, known as data centers. Such computing facilities house and accommodate a large number of server, network, and other computer equipment suitable to process, store, and exchange data as desired to facilitate the organization's operations. Data centers can be located local to the organization or remote from the organization, such that data can be exchanged to and from the data center over a hard wire, over the internet, or a combination of the two. Typically, a computer room of a data center includes many racks that each includes a rack housing that supports a plurality of racks that are spaced from one another so as to define a corresponding plurality of mounting slots, otherwise known as bays. The racks are configured to support a respective plurality of servers that are rack-mounted to the rack housing in the bays so as to define a rack system.

Data centers typically include a number of components that generate a significant amount of waste heat during operation. Such components include printed circuit boards, mass data storage devices, power supplies, and processors. For example, some computers with multiple processors can generate 250 watts of waste heat. For example, a standard 19-inch rack may hold ten to twenty servers of various heights of 1U, 2U, and 3U (wherein "U" designates a rack unit of 1.75 inches). Some conventional rack systems can include up to forty or more such rack-mounted components, and such rack systems can generate as much as 10 kilowatts of waste heat. It is thus recognized that removal of waste heat is a significant challenge in the day-to-day management of data centers.

One conventional attempt to thermally regulate rack systems includes the division of the data center room into hot air aisles and cold air aisles. Cold air is fed through the cold air aisle, such that internal fans of the individual servers draw the cold air from the cold air aisle around various server components, and expel heated air into the hot air aisle. It should thus be appreciated that the racks are open to both the cold air aisles and the warm air aisles. Accordingly, steps are typically taken to filter the air in the data center to remove particulates that could otherwise be drawn into the servers, thereby adding cost and complications to management of the data center.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 5 is a front elevation view of rack system as illustrated in FIG. 2A, constructed in accordance with an alternative embodiment and shown with a portion of the housing removed to illustrate the interior space of the rack housing and the cooling system disposed in the interior space;

FIG. 6 is a front elevation view of rack system as illustrated in FIG. 5, but constructed in accordance with an alternative embodiment;

FIG. 7 is a side elevation view of the rack system as illustrated in FIG. 2A, but constructed in accordance with an alternative embodiment and shown with a portion of the housing removed to illustrate the interior space of the rack housing and the cooling system disposed in the interior space; and FIG. 8 is a side elevation view of the data center illustrated in FIG. 1, but showing the cooling system constructed in accordance with another embodiment.

DETAILED DESCRIPTION

Figure 1:
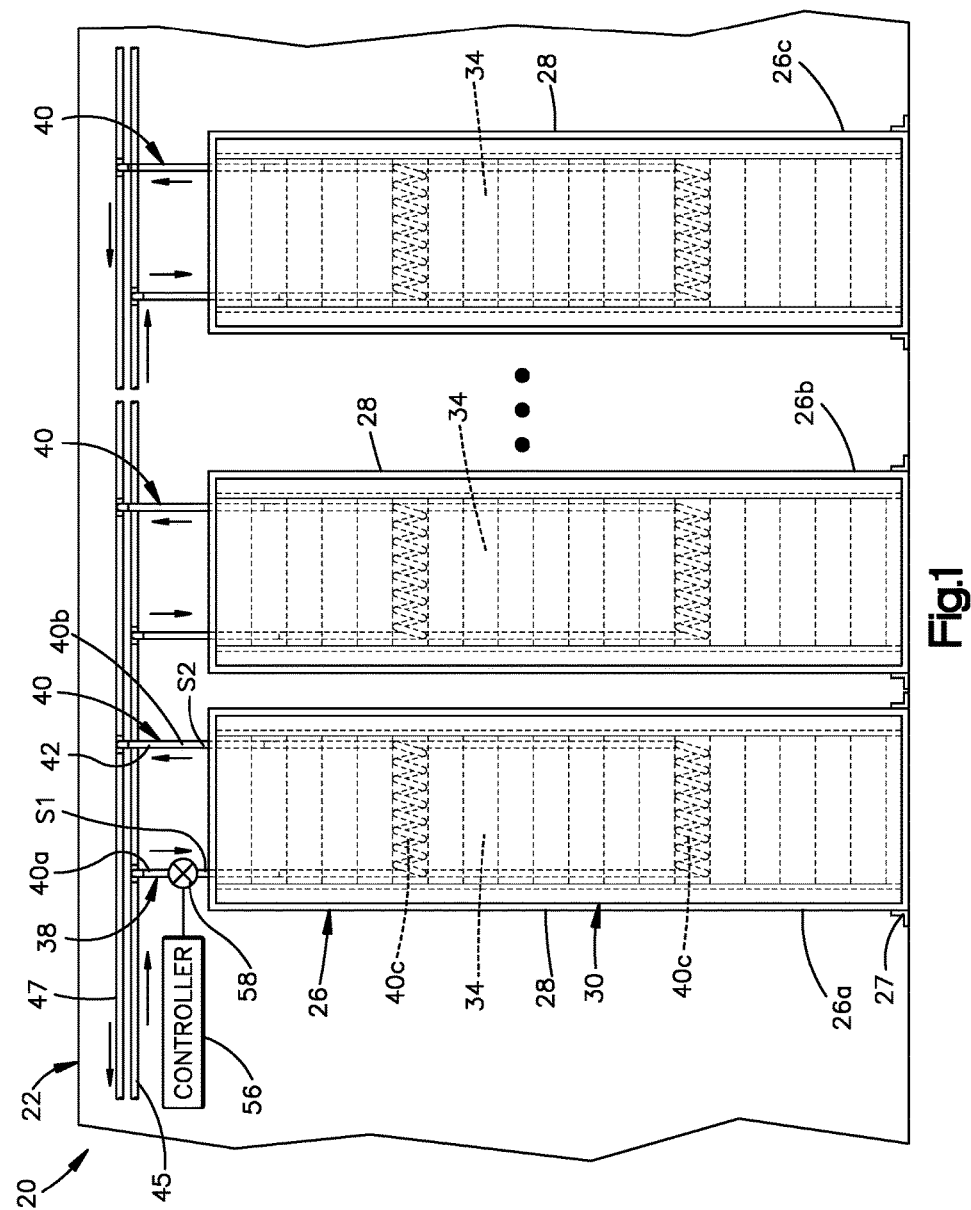
FIG. 1 is a schematic side elevation view of a data center including a computing room and a plurality of rack systems disposed in the computing room.

Systems and methods in accordance with various embodiments of the present disclosure provide the ability to remove heat from racks of a data center. For example, in one embodiment, a conduit can extend into the rack housing, through the interior space of the rack housing, and out of the rack housing. A fluid having a fluid temperature less than that of the air temperature of the interior space of the rack housing can flow through the conduit, such that heat is transferred from the interior space to the fluid to produce cooled air in the interior space. The cooled air is drawn into the air-cooled servers that are mounted on the rack in the interior space, to allow for the dissipation of heat from electrical components of the servers. The flow of the fluid in the conduit out of the rack housing causes the transferred heat to be removed from the interior space.

According to one embodiment, because the system does not rely on airflow between the interior space and the computing room of the data center within which the rack resides, the interior space can be at least substantially encapsulated by the rack housing so as to substantially eliminate airflow between the interior space of the rack housing and the computing room. For instance, the interior space can be sealed, and thus air tight, with respect to airflow between the interior space of the rack housing and the computer room.

Further, according to one embodiment, the system can include conventional computing devices that do not require modification in order to facilitate removal of heat from the rack mounted computing devices.

Further still, according to one embodiment, the system does not occupy rack space that can otherwise be reserved for rack mounted computing devices.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "computing room" refers to a room in a data center in which at least one rack resides. The room can be fully or partially defined by at least one computing room wall in the data center, or can be defined by an open space in a data center. The computing room wall can be disposed within the data center, or can be defined by an exterior wall of the data center.

As used herein, "rack housing" refers to a housing that at least partially defines an interior space within which at least one rack resides.

As used herein with reference to the rack housing, "interior space" means a space, area, or volume at least partially defined by the rack housing;

As used herein, "rack" means a rack, container, frame, bracket, plurality of brackets, or any other element or combination of elements that can contain or physically support one or more computing devices.

As used herein with reference to a rack housing, the term "substantially encapsulate" can refer to a degree of encapsulation of the interior space of the rack housing that either 1) does not allow airflow between the room and the interior space in sufficient quantity to alone remove a sufficient amount of heat from the computing devices to support the normal operation of the computing devices mounted to the rack in the interior space, 2) does not allow air to flow from the room to the interior space at a rate that would allow air-laden particulates to flow from the room into the interior space in sufficient quantity to adversely affect the normal operation of the computing devices mounted to the rack in the interior space, or 3) both.

As used herein, "computing device" includes any of various devices in which computing operation or data storage can be performed. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively or additionally, memory may include a compact disc-read only memory (CD-ROM), a magneto-optical disk (MOD), and/or a digital versatile disc (DVD). Also, additional input channels may include computer peripherals associated with an operator interface such as a mouse and a keyboard. Alternatively, other computer peripherals may also be used that may include, for example, a scanner. Further, in some embodiments, additional output channels may include an operator interface monitor and/or a printer.

As used herein, "conduit" means any line, tube, pipe, duct, or other elongate hollow member configured to retain a fluid that flows therein. A conduit can have any size, shape, and cross-section. Further, a conduit can extend along any direction of elongation as desired, such as a substantially straight direction of elongation, a curved direction of elongation, such as a coil, an angled direction of elongation, or any combination thereof.

Referring to FIG. 1, a data center 20 can include one or more computing rooms, such as a computing room 22, and at least one rack system 26, such as a plurality of rack systems 26a, 26b, and 26c disposed in the computing room 22. While the data center 20 illustrates three rack systems 26a-26c disposed in the computing room 22, it should be appreciated that the data center 20 can include any number of rack systems 26 in the computing room 22 as desired. Further, it should be appreciated that the data center 20 can include any number of computing rooms 22 as desired, including at least one computing room 22 such as a plurality of computing rooms 22.

Figure 2B:
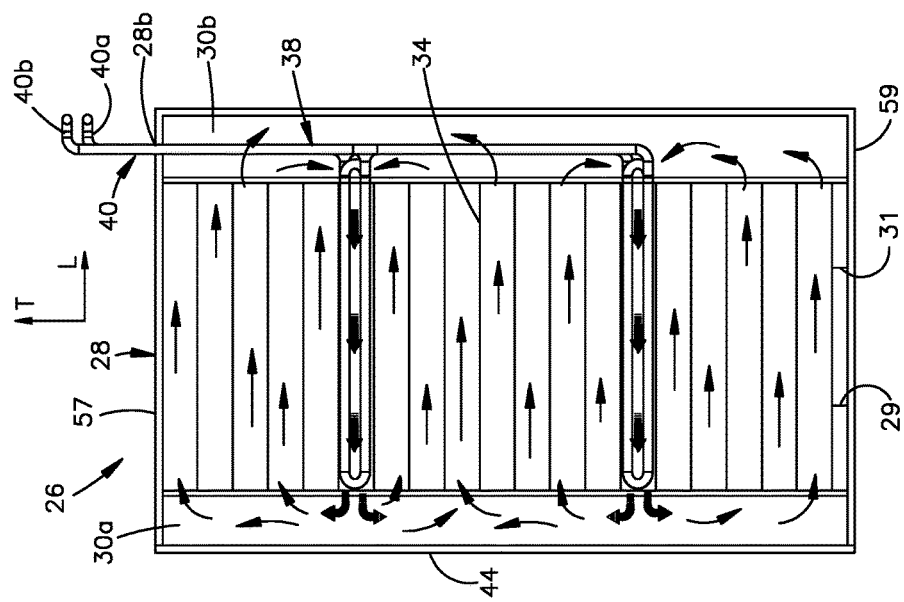
FIG. 2B is a side elevation view of the rack system illustrated in FIG. 2A, with a portion of the housing removed to illustrate the interior space of the rack housing and the cooling system disposed in the interior space.

Referring to FIGS. 1-2B, each rack system 26 includes a rack housing 28 that at least partially defines an interior space 30, and a rack 32 supported by the rack housing 28 in the interior space 30. For instance, the rack housing 28 can encapsulates the interior space 30 so as to seal the interior space 30 with respect to airflow in and out of the interior space 30. Each rack system 26 can further include at least one computing device such as a plurality of computing devices 34 that are configured to be mounted to the rack 32 in the interior space 30. For instance, the rack 32 can define a plurality of bays 36 that are each configured to receive a computing device 34 that is supported by the rack 32, though it should be appreciated that the rack 32 can define any suitable alternative shape and size as desired so as to support the computing devices 34 in any alternative manner as desired. The rack housing 28 can further support at least one data bus 29 in the interior space 30, the data bus 29 configured to be placed in communication with the computing devices 34. The rack housing 28 can further support at least one power distribution unit 31 in the interior space 30, the power distribution unit 31 configured to carry an output voltage and configured to be placed in electrical communication with the computing devices 34 so as to supply electrical power to the computing devices. Each rack system 26 can include one or more brackets 27 that attaches the rack housing 28 to the floor of the computing room 22, or the rack housings 28 can be free standing on the floor of the computing room 22 or any suitable support surface as desired.

The rack housing 28 can further include an access door 44 that is movable so as to provide selective access to the interior space 30. For example, the access door 44 is movable to the open position illustrated in FIG. 2A, for instance for a temporary duration, when it is desired to access the rack interior 30, for example when it is desired to service the rack system 26, e.g., to remove a computing device from the rack 32, to connect a computing device to the rack 32, to service one of the computing devices, or the like. It is recognized that moving the access door 44 to the open position causes the interior space 30 of the rack housing 28 to be placed in temporary air flow communication with the computing room 22. The access door 44 is movable to the closed position illustrated in FIG. 2B when it is desired to isolate the interior space 30 from the ambient air in the computing room 22, thereby protecting the computing devices 34 from contaminants in the air of the computing room and potential elevated temperatures of the air in the computing room 22. As will be appreciated from the description below, the rack housing 28 can at least substantially encapsulate the interior space 30 when the access door 44 is in the closed position. For instance, the rack housing 28 can be air tight so as to seal the interior space 30 with respect to airflow with the computing room 22.

The rack system 26, and thus the data center 20, can further include a cooling system 38 that includes a conduit 40 that extends through the rack housing 28 and into the interior space at least at one interface, such as a first interface 28a and a second interface 28b. The conduit 40 can extend into the interior space 30 at the first interface 28a, and out of the interior space 30 at the second interface 28b. The first interface 28a can be disposed at a first location of the rack housing 28, and the second interface 28b can be disposed at a second location of the rack housing 28 that is different from the first location of the rack housing 28. The rack housing 28 can be sealed at the first and second interfaces 28a and 28b so as to prevent air from flowing between the interior space 30 and the computing room 22 through the first and second interfaces 28a and 28b. The cooling system 38 further includes a fluid 42 that flows through the conduit 40 at a fluid flow rate, such that heat is transferred from air in the interior space 30 to the fluid 42 so as to produce cooled air in the interior space 30 of the rack housing 28. The fluid 42 flows through the conduit 40 from the interior space 30 to a location out the interior space 30, thereby transporting the transferred heat out of the rack housing 28. The conduit 40 can be configured as desired inside the interior space 30 so as to remove heat from the air in the interior space 30.

As will be appreciated from the description below, the cooling system 38 can be an open system or a closed system. The conduit 40 can define a fluid intake 40a, a fluid outlet 40b, and at least one heat exchanger region 40c that extends between the fluid intake 40a and the fluid outlet 40b. For instance, the at least one heat exchanger region 40c can be disposed at a location adjacent the bays 36. At least a portion up to an entirety of the at least one heat exchanger region 40c is disposed in the interior space 30 of the rack housing 28, and both the fluid intake 40a and the fluid outlet 40b can be disposed external to the rack housing 28. In accordance with one embodiment, the heat exchanger region 40c can be configured as heat exchanger coils that are in fluid communication with the fluid intake 40a and the fluid outlet 40b. For instance, the coils, and thus the heat exchanger region 40c, receives the fluid 42 from the fluid intake 40a, causes the fluid 42 to flow throughout a portion of the interior space, and exhausts the fluid 42 to the fluid outlet 40b. It should be appreciated that the heat exchanger region 40c can define any suitably shaped path as desired, and can be of any size as desired. In accordance with one embodiment, the conduit 40 can include a pair of heat exchanger regions 40c that are spaced from each other vertically along the rack 32 and connected between the fluid intake 40a and the fluid outlet 40b, though it should be appreciated that the conduit 40 can include any number of heat exchanger regions 40c as desired, positioned in the interior space 30 as desired.

Figure 2A:
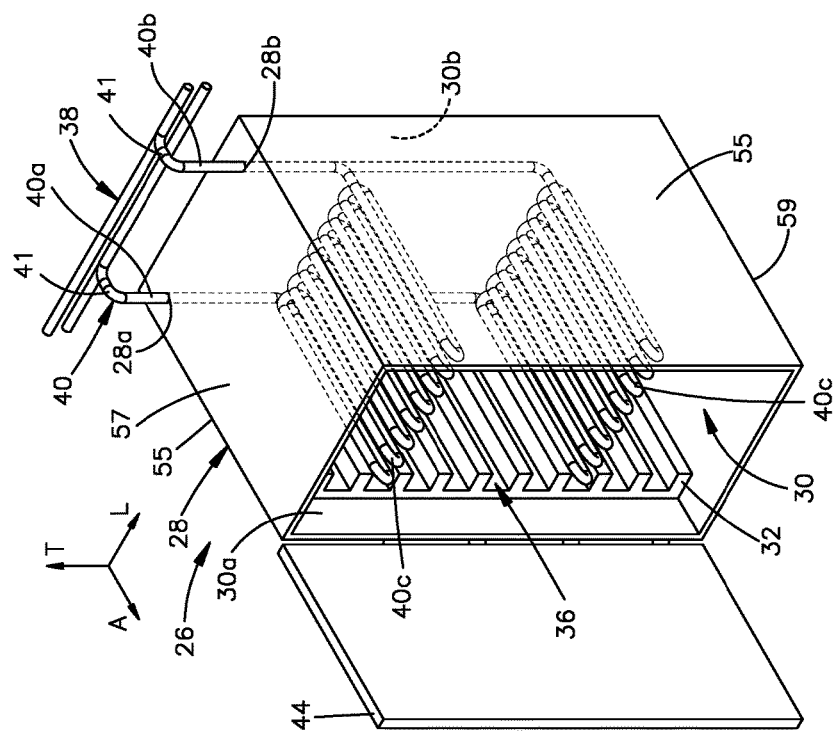
FIG. 2A is a perspective view of one of the rack systems illustrated in FIG. 1, including a rack housing that defines an interior space, a rack supported by the rack housing, and a cooling system that extends into the interior space.

During operation, the fluid 42 flows from a fluid source, which can be configured as an intake manifold 45 or any suitable alternatively constructed fluid source, to the fluid intake 40a. For instance, as illustrated in FIG. 2A, the conduit 40 can include a coupling 41 at the fluid intake 40a that is configured to attach to the intake manifold 45, so as to place the conduit 40 in fluid communication with the intake manifold 45 to receive fluid from the intake manifold 45. The conduit 40 can further include a coupling 41 at the fluid outlet 40b that is configured to attach to the outlet manifold 47, so as to place the conduit 40 in fluid communication with the outlet manifold 47 to outlet fluid from the conduit to the outlet manifold 47. Each heat exchanger region 40c can receive at least a portion up to an entirety of the fluid 42 from the fluid intake 40a. The fluid 42 in the heat exchanger region 40c receives heat that is transferred from the ambient air in the interior space 30 to the fluid 42. The air in the interior space 30 thus has a first air temperature before heat is transferred to the fluid 42, and second air temperature after heat is transferred from the air to the fluid. Because the second temperature is less than the first temperature, the air that has transferred heat to the fluid 42 can be referred to as cooled air. The fluid 42 can then flow from each heat exchanger region 40c to the fluid outlet 40b so as to transport the transferred heat out of the rack housing 28. The fluid 42 then flows from the fluid outlet 40b to an outlet manifold 47. The fluid 42, which can be water, can be discarded down any suitable drain, or heat can be removed from the fluid 42 and the fluid 42 can be recirculated to the intake manifold 45 as described in more detail below. It should be appreciated that a plurality of heat exchanger regions 40c can be connected between the same fluid intake 40a and the same fluid outlet 40b. Thus, a portion of the fluid 42 in the fluid intake 40a can be delivered to each of the heat exchanger regions 40c. Alternatively, each fluid intake 40a can be coupled to a single dedicated heat exchanger region 40c such that each heat exchanger region 40c receives all fluid 42 from the respective fluid intake 40a. Each heat exchanger region 40c can outlet its fluid into a dedicated fluid outlet region 40b or into a common fluid outlet region 40b.

It should thus be appreciated that the heat exchanger region 40c can define a heat transfer region of the conduit 40. The conduit 40, and in particular the heat exchanger region 40c of the conduit 40, can be made of any suitable material, and preferably a material that has adequate heat transfer properties to conduct the heat transferred from the ambient air in the interior space 30 to the fluid 42 in the conduit 40. The fluid 42 can be any suitable fluid configured to receive a suitable amount of heat from the interior space 30 as the fluid 42 travels through the heat exchanger region 40c. For instance, the fluid 42 can be a gas or liquid, such as water or any suitable refrigerant as desired, such as ammonia, sulfur dioxide, or any suitable hydrocarbon, for instance a non-halogenated hydrocarbon. Thus unless otherwise indicated, the fluid is not intended to be limited to any particular fluid.

Figure 3:
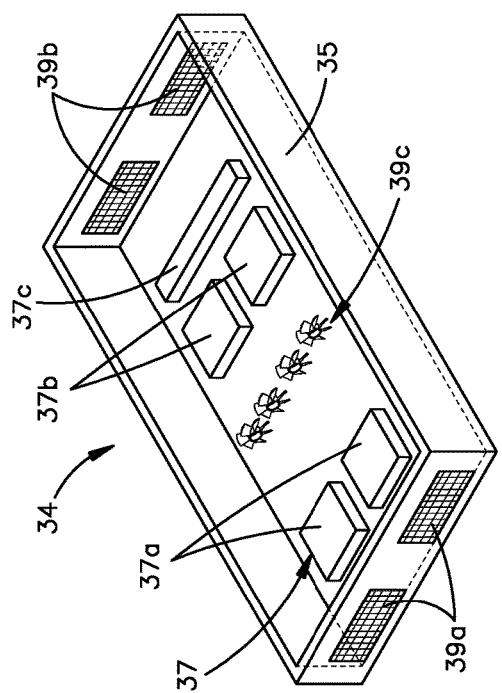
FIG. 3 is a schematic perspective view of one of the computing devices mounted to the rack as illustrated in FIG. 1, with portions removed to illustrate various computing device components.

Referring now to FIGS. 1-3, the computing devices 34 can each include an outer housing 35 that contains a plurality of electrical components 37 of the computing device 34. For instance, electrical components 37 can include one or more hard drives 37a, processors 37b, and memory modules 37c. Each of the electrical components 37 can produce heat during operation of the computing device 34. The computing devices 34 can further include at least one air intake 39a that can be configured as a vent that extends through the housing 35, at least one air outlet 39b that can be configured as a vent that extends through the housing 35, and at least one fan such as a plurality of fans 39c that draw the cooled air from the interior space 30 of the rack housing 28 through the air intake 39a. The drawn air travels through the housing 35 and is exhausted from the housing 35 through the air outlet 39b. Thus, the fans 39c of the plurality of computing devices 34 mounted on the rack 32 induce a pressure within the housing 28 that draws the cooled air from the interior space 30 into the outer housing 35, and exhaust air out the housing 35 through the air outlet 39b after the air has received heat that was transferred to the air from the electrical components 37. Alternatively, the fans 39c can be replaced with one or more fans that are disposed in the interior space 30, but outside the housings 35, that operate so as to direct air into the air intake 39a, through the housing 35, and out the air outlet 39b. Alternatively still, the fans 39c can be disposed in the housing 35 in addition to fans disposed in the interior space 30 but outside the housing 35.

In accordance with one embodiment, the rack housing 28 can define a front end 30a of the interior 30 and a rear end 30b of the interior 30 that is spaced from the front end 30a along a longitudinal direction L. The air intake 39a and the air outlet 39b can be positioned such that air is drawn from a first end of the interior 30, which can be defined by the front end 30a, through the air intake 39a and into the housing 35, and exhausted out the air outlet 39b into a second end of the interior 30 that is opposite the first end. For instance, the second end of the interior 30 can be defined by the rear end 30b. As the air flows over one or more, up to all, of the heat producing electrical components 37 in the housing 35, the heat is transferred to the air and thus dissipated from the electrical components 37. In particular, heat is transferred from the electrical components 37 to the air that flows through the air intake 39a and into the housing 35. Accordingly, the air is drawn into the air intake 39a at a first temperature, and exits the air outlet 39b at a second temperature that is greater than the first temperature. Thus, the exited air can be referred to as warm air. As described herein, heat is transferred from the warm air to the fluid 42 in the heat exchanger region 40c of the conduit 40 so as to produce the cooled air that is preferably at a temperature sufficient to receive an amount of heat from the electrical components 37 that is suitable for the reliable operation of the computing device 34.

The at least one heat exchanger region 40c can be disposed at any location as desired. For instance, in accordance with one embodiment, each of the heat exchanger regions 40c can be disposed in a corresponding one or more of the bays 36 so as to extend along the longitudinal direction L between the front end 30a and the rear end 30b. Thus, at least a portion of the air that is exhausted out the air outlets 39b travels over the heat exchanger region 40c along a direction from the rear end 30b to the front end 30a to produce cooled air that is again forced into the air intakes 39a, either by negative pressure induced by the at least one fan 39c, by pressure induced by at least one fan disposed in the interior 30 but outside the housing 35, or both. Accordingly, at least a portion of the conduit 40, for instance at the at least one heat exchanger region 40c, can be disposed adjacent at least one of the air intakes 39a and the air outlets 39b of the plurality of computing devices 34. The fans 39c of the plurality of computing devices draw air along respective air intake paths through the air intakes 39a, and the at least a portion of the conduit 40, for instance at the at least one heat exchanger region 40c, can be disposed proximate to the air intakes 39a so as to be positioned in the respective air intake paths. The fans 39c exhaust air out the air outlet 39b along respective air exhaust paths, and the at least a portion of the conduit, for instance at the heat exchanger region 40c, can be disposed proximate to the air outlets 39b so as to be positioned in the respective air exhaust path. The fans 39c of the plurality of computing devices 34 can draw air along respective air intake paths through the air intakes and exhaust air out the air outlet 39b along respective air exhaust paths. At least a portion of the conduit 40, for instance at the heat exchanger region 40c, can define a first region disposed proximate to the air intakes 39a so as to be positioned in the respective air intake paths, and a second region disposed proximate to the air outlets 39b so as to be positioned in the respective air exhaust path.

A method of constructing the rack system 26 can include the steps of constructing the rack housing 28 in an ambient environment, which can be defined by the ambient environment of the computing room 22, such that the rack housing 28 substantially encloses the interior space 30. The method can further include the step of supporting the rack 32 in the rack housing 28, such that the rack 32 is configured to support a plurality of the computing devices 34. The method can further include the step of supporting at least one conduit, such as the conduit 40, in the rack housing 28 such that the conduit 40 enters the interior space 30 at a first location of the rack housing 28, extends in the interior space 30, and exits the interior space 30 at a second location of the rack housing 28 that is different than the first location. The method can further include the step of placing the conduit 40 in fluid communication with a fluid source, such that the fluid can flow from the fluid source through the conduit 40. The method can further include the step of placing the conduit 40 in communication with a drain such that fluid that has flown from the fluid source through the conduit 40 exits the conduit 40 into the drain.

Figure 4:
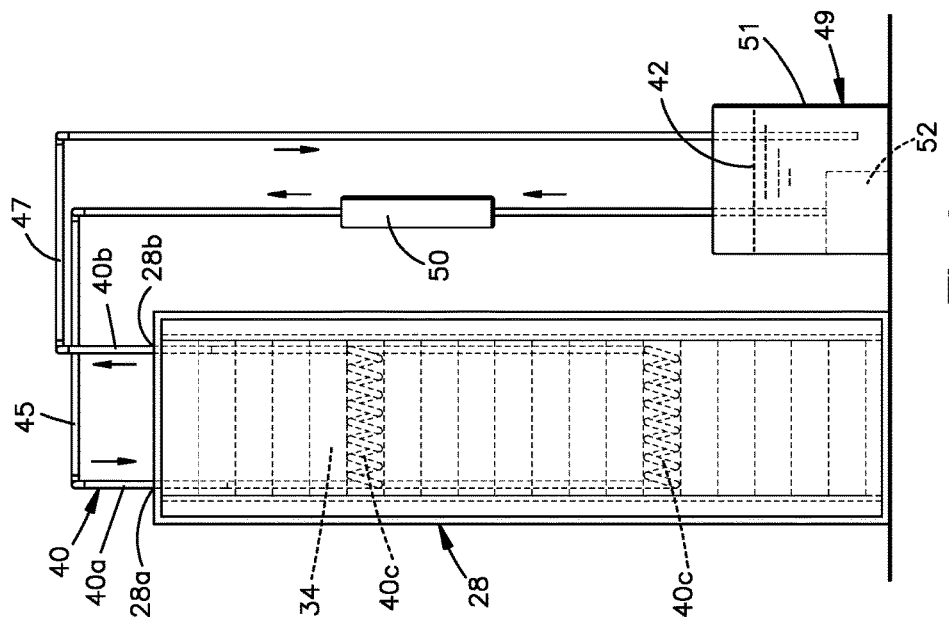
FIG. 4 is a schematic elevation system showing a heat rejection apparatus.

Referring now to FIGS. 1 and 4, in accordance with another embodiment, the cooling system 38 can be a closed system whereby the fluid intake 40a is in fluid communication with the fluid outlet 40b, such that the fluid 42 travels from the fluid outlet 40b, through a heat rejection apparatus 49, which can be constructed as desired. For instance, the fluid 42 can exit the conduit 40 through the fluid outlet 40b into any suitable reservoir 51. The heat rejection apparatus 49 can include a pump 52 that can, under pressure, deliver the fluid 42 from the reservoir 51 into the fluid intake 40a. The heat rejection apparatus 49 can further include a cooled space 50, such that the fluid 42 can flow from the reservoir 51 and through the cooled space that removes heat from the fluid 42. Thus, the fluid 42 can flow through the fluid intake as cool fluid having a suitable heat absorbing capacity when it flows through the at least one heat exchanger region 40c in the manner described above. Alternatively, the cooled space can be defined by the reservoir 51, such that heat is removed from the fluid in the reservoir 51, and the fluid 42 is then delivered to the fluid intake 40a without traveling through any additional refrigeration components. It is thus appreciated that heat can be removed from the fluid 42 in any manner as desired. Alternatively still, the cooling system 38 can be configured as an open system whereby the fluid 42 can be expelled from the fluid outlet 40b to any suitable receptacle, such as a drain. The intake manifold 45 can receive the fluid 42, configured as water, from a public water utility, irrigation system, well, lake, river, or other water source as desired.

Because the cooling system 38, both when configured as an open system and when configured as a closed system, can operate without relying upon airflow between the interior space 30 of the rack housing 28 and the room, the rack housing 28 can at least substantially encapsulate or fully encapsulate the interior space 30, in particular when the access door 44 is in the closed position. Furthermore, rack systems having higher cooling demands do not adversely affect the ability of adjacent rack systems having lower cooling demands to draw cool air, as can be the case in conventional data centers where the rack systems draw cooled air from the same ambient air supply.

With continuing reference to FIG. 1, it is recognized that a greater amount of heat can transfer from the interior space 30 to the fluid 42 when the fluid 42 flows through the heat exchanger region 40c at low fluid flow rates than when the fluid 42 flows through the heat exchanger region 40c at high fluid flow rates. Thus, in accordance with one embodiment, the cooling system 38 can be configured to control the fluid flow rate of the fluid 42 through the heat exchanger region 40c. For instance, the cooling system 38 can include controller 56, a flow regulator such as a valve 58 in electrical communication with the controller 56, a first temperature sensor S1 in electrical communication with the controller 56, and a second temperature sensor S2 in electrical communication with the controller 56. The first temperature sensor S1 is disposed at a first location of the conduit 40 and is configured to provide a first output that corresponds to a first fluid temperature of the fluid at a first location of the conduit 40. The second temperature sensor S2 is disposed at a second location of the conduit 40 and is configured to provide a second output that corresponds to a second fluid temperature of the fluid at the second location of the conduit 40. As described above, the fluid temperature at the fluid intake 40a is less than the fluid temperature at the fluid outlet 40b. Thus, the first location can be disposed upstream of the interior space 30, and the second location can be disposed downstream of the interior space 30. The temperature sensors S1 and S2 can be configured as thermocouples or any suitable alternative apparatus suitable for sending the first and second outputs to the controller 56. It should be appreciated that the actual temperatures of the fluid at the first and second locations can be communicated to the controller 56 or a signal, for instance a voltage differential, indicative of the actual temperatures of the fluid at the first and second locations can be communicated to the controller 56.

It should be appreciated that, as used herein, the term "downstream" used with respect to a direction of fluid flow refers to a direction of fluid flow from the fluid intake 40a to the fluid outlet 40b, and that the term "upstream" used with respect to fluid flow refers to a direction opposite the downstream direction. In both embodiments wherein the cooling system 38 is an open system and a closed system, it can be said that the fluid outlet 40b is disposed downstream from each of the heat exchanger region 40c and the fluid intake 40a with respect to fluid flow. The heat exchanger region 40c is disposed downstream from the fluid intake 40a and upstream from the fluid outlet 40b with respect to fluid flow. The fluid intake 40a is disposed upstream from each of the heat exchanger region 40c and the fluid outlet 40b with respect to fluid flow.

The controller 56 can receive the first and second outputs and determines a difference between the fluid temperature of the fluid at the first and second locations. The controller 56 compares the difference to a predetermined threshold, and adjusts the valve 58 so as to control the fluid flow rate of the fluid 42 through the conduit 40. The predetermined threshold can be input into the controller 56 and can reflect a desired amount of heat transfer from the air in the interior space 30 to the fluid 42 that is sufficient for the normal operation of the computing devices 34, but not so large that it causes more heat to be transferred than necessary, as such can decrease the efficiency of the cooling system 38 and can further unnecessarily heat the fluid 42, particularly where the system 38 is a closed system or where the conduit 40 extends from the rack housing 28 into a second rack housing 28 to remove heat from the second rack housing (see FIG. 8) before the fluid 42 travels out the fluid outlet 40b. Thus, when the difference between the first and second temperatures is greater than the predetermined threshold, the controller 56 responds by sending a signal to actuate the valve along an open direction that increases the flow area of the valve 58, thereby increasing the fluid flow rate of the fluid 42 through the heat exchanger region 40c. When the difference between the first and second temperatures is less than the predetermined threshold, the controller 56 responds by sending a signal to actuate the valve 58 along a closed direction that reduces the flow area through the valve 58, thereby decreasing the fluid flow rate of the fluid 42 through the heat exchanger region 40c. Thus, each rack system 26 can include a controller 56 and a valve 58, or the controller 56 can be configured to actuate one or more valves 58 that regulate fluid flow through the respective fluid intakes 40a of the rack systems 26. Alternatively, the rack systems 26 can be devoid of the valve 58, and the controller can selectively increase and decrease fluid flow through a pump that drives the fluid 42 from the reservoir 51 through the conduit 40.

With continuing reference to FIGS. 1-3, the rack housing 28 can define the front end 30a of the interior space 30 and the rear end 30b of the interior space 30 that is opposite the front end 30a along the longitudinal direction L. The rack housing 28 can further define a pair of side walls 55 that are spaced apart from each other along a lateral direction A that is substantially perpendicular to the longitudinal direction L. The access door 44 can define the front end 30a of the interior space 30, and a rear wall of the rack housing 28 can define the rear end 30b of the interior space 30. The computing devices 34 can be mounted to the rack 32 such that the air intakes 39a are positioned proximate to a first region of the interior space 30, which can be defined by the front end 30a, and the air outlets 39b are positioned proximate to a second region of the interior space 30, which can be defined by the rear end 30b. Accordingly, during operation, the computing devices 34 can draw the cooled air from the front end 30a and can exhaust the warm air into the rear end 30b, though it should be appreciated that the computing devices 34 can be positioned in any orientation as desired in the interior space 30.

As illustrated in FIG. 2A, the at least one heat exchanger region 40c of the conduit 40 can be disposed in a respective one of the bays 36 so as to be spaced from each other along a transverse direction T that is perpendicular to each of the longitudinal direction L and the lateral direction A. The transverse direction T defines height of the interior space 30, and thus of the rack housing 28. For instance, the rack housing 28 can define an upper wall 57 and a lower wall 59 that are spaced from each other along the transverse direction T. Thus, one more of the computing devices 34 can be disposed above the at least one heat exchanger region 40c along the transverse direction T. Alternatively or additionally, one or more of the computing devices 34 can be disposed below the at least one heat exchanger region 40c along the transverse direction T.

As described above, the at least one heat exchanger region 40c can be positioned at any location in the interior space 30 so as to remove heat from the air circulated from the air outlets 39b to the air intakes 39a. Further, the heat exchanger regions 40c of each rack system 26 can receive fluid 42 from the same fluid intake 40a or from different fluid intakes. For instance, as illustrated in FIGS. 5-6, a first heat exchanger region 40c can be disposed between the computing devices 34 and a first one of the side walls 55, and a second heat exchanger region 40c can be disposed between the computing devices and a second one of the side walls 55. Thus, the rack system 26 can include at least one heat exchanger region 40c disposed between the computing devices 34 and at least one side wall 55 along the lateral direction A. As described above, the heat exchanger regions 40c can extend between the front end 30a of the interior space 30 and the rear end 30b of the interior space, such that warm exhaust air output by the computing devices 34 along respective air exhaust paths flows past at least one heat exchanger regions 40c exhaust paths, whereby heat is transferred from the warm air to the fluid 42 to produce cooled air in the interior space 30 that is ultimately drawn along respective air intake paths and into the air intakes 39a of the computing devices 34. As illustrated in FIG. 5, the conduit 40 can be split at a junction 41 such that each of the heat exchanger regions 40c can receive fluid 42 from a common intake 40a as illustrated in FIG. 5. Alternatively, each of the heat exchanger regions 40c can receive fluid from respective different intakes 40a as illustrated in FIG. 6. The different intakes 40a can receive fluid 42 from the same fluid source or from different fluid sources. Alternatively still, as illustrated in FIG. 7, a first heat exchanger region 40c can be disposed between an uppermost one of the computing devices 34 and the upper wall 57 along the transverse direction T, and a second heat exchanger region 40c can be disposed between a lowermost one of the computing devices 34 and the lower wall 59. The first and second heat exchanger regions 40c can be in fluid communication with a common fluid intake 40a or different fluid intakes 40a in the manner described above.

Referring again to FIG. 5, the cooling system 38 can include the first temperature sensor S1 in the fluid intake 40a in the manner described above, and the second temperature sensor S2 in one of the fluid outlets 40b in the manner described above so as to regulate the temperature of the fluid that flows through one of the heat exchanger regions 40c. The cooling system 38 can further include a third temperature sensor S3 in a third location of the other of the fluid outlets 40b in the manner described above so as to regulate the temperature that flows through the other of the heat exchanger regions 40c when the heat exchanger regions receive fluid 42 from the same fluid inlet 40a. The controller 56 (see FIG. 1) can receive the outputs from the temperature sensors S1 and S2 and determine a difference between the fluid temperature of the fluid at the first and second locations. The controller 56 (see FIG. 1) can receive the outputs from the temperature sensors S1 and S3 and determine a difference between the fluid temperature of the fluid at the first and third locations. The controller 56 compares the differences to a predetermined threshold, and adjusts the valve 58 so as to control the fluid flow rate of the fluid 42 through the conduit 40. When the difference between fluid temperatures at the first and second locations and the difference between fluid temperatures at the first and third locations are each greater than the predetermined threshold, the controller 56 responds by sending a signal to actuate the valve along an open direction that increases the flow area of the valve 58, thereby increasing the fluid flow rate of the fluid 42 through the heat exchanger region 40c. When one of the differences is less than the predetermined threshold, the controller 56 responds by sending a signal to actuate the valve 58 along a closed direction that reduces the flow area through the valve 58, thereby decreasing the fluid flow rate of the fluid 42 through the heat exchanger region 40c.

Referring to FIG. 6, the cooling system 38 can further include a third temperature sensor S3 in electrical communication with the controller 56, and a fourth temperature sensor S4 in electrical communication with the controller 56 (see FIG. 1). The first and second temperature sensors S1 and S2 are disposed at a first fluid intake 40a and a first fluid outlet 40b, respectively, of a first conduit 40 that is in fluid communication with a first one of the heat exchanger regions 40c. A first valve 58a can be opened and closed in response to control signals from the controller 56 to increase and decrease the flow rate of the fluid 42 through the first conduit 40 in the manner described above.

The third and fourth temperature sensors S3 and S4 are disposed at a second fluid intake 40a and a second fluid outlet 40b, respectively, of a second conduit 40 that is in fluid communication with a second one of the heat exchanger regions 40c. The third temperature sensor S3 is configured to provide a third output that corresponds to a third temperature of the fluid 42 at a first location of the second conduit 40, for instance at the fluid intake 40a. The fourth temperature sensor S4 is disposed at a second location of the second conduit 40, for instance at the fluid outlet 40b, and is configured to provide a second output that corresponds to a fourth temperature of the fluid at the second location of the second conduit 40. A second valve 58a can be opened and closed in response to control signals from the controller 56 to increase and decrease the flow rate of the fluid 42 through the second first conduit 40. When the difference between the third and fourth temperatures is greater than the predetermined threshold, the controller 56 responds by sending a signal to actuate the second valve 58b along an open direction that increases the flow area of the second valve 58b, thereby increasing the flow rate of the fluid 42 through the second heat exchanger region 40c. When the difference between the third and fourth temperatures is less than the predetermined threshold, the controller 56 responds by sending a signal to actuate the second valve 58b along a closed direction that reduces the flow area through the second valve 58b, thereby decreasing the flow rate of the fluid 42 through the second heat exchanger region 40c. It should be appreciated that the controller 56 that controls the second valve 58b can be the same controller or a different controller that controls the first valve 58a.

It should be appreciated that the cooling system 38 can include as many heat exchanger regions 40c as desired, one or more up to all of which can be defined by separate conduits 40 that receive their respective fluid 42 from the a common fluid source or different fluid sources. The heat exchanger regions 40c can be positioned anywhere in the interior space 30 as desired. The flow rate of the fluid 42 of one or more up to all of the conduits 40 can be controlled by one or more respective controllers 56 as desired. Further, two or more of the conduits 40 can support fluid flow of the fluid 42 in opposite directions with respect to each other through the interior space 30. Thus, a first heat exchanger region 40c can transport the contained fluid 42 along a first direction, for instance from a first end to a second end, and a second heat exchanger region 40c can transport the contained fluid 42 along a second direction that is substantially opposite the first direction, that is from the second end toward the first end. Thus, the first heat exchanger region 40c and the second heat exchanger region 40c support fluid flow in opposite directions with respect to each other. The first and second ends can be defined by opposed ends of the interior space, such as the upper and lower ends, respectively. Because the first and second heat exchanger regions 40c and 40c' can define respective reverse fluid flows, the fluid of one of the first and second heat exchanger regions 40c and 40c' is coolest when disposed adjacent to the computing devices 34 disposed at one end of the rack 32 (for instance the lowermost computing devices 34), and the fluid of the other of the first and second heat exchanger regions 40c and 40c' is coolest when disposed adjacent to the computing devices 34 at a second end of the rack opposite the first end of the rack (for instance the uppermost computing devices 34), thereby providing substantially uniform heat transfer adjacent each of the computing devices 34 in the interior space 30.

As described above, the cooling system 38 can include at least one conduit 40 that extends through at least one rack housing 28. Referring to FIG. 8, the cooling system 38 can include at least one conduit 40 that extends through more than one rack housings 28 that can be disposed in the same computing room 22 or in different computing rooms 22 in the data center 20. For instance, the fluid intake 40a of the conduit 40 can receive fluid from the fluid source as described above. The conduit 40 can include a first at least one heat exchanger region 40c, and a second at least one heat exchanger region 40c, that is disposed downstream of the first at least one heat exchanger region 40c. The first at least one heat exchanger region 40c can extend through the interior space 30 of the rack housing 28, which can be referred to as a first interior space 30 of a first rack housing 28, in any manner described above, and the second at least one heat exchanger region 40c can extend through a second interior space 30 of a second rack housing 28 in any manner described above. The fluid outlet 40b can be disposed downstream of the second rack housing 28. The first and second locations of the first and second temperature sensors S1 and S2 can be disposed at a location upstream of the first rack housing 28 and downstream of the second rack housing 28b. The controller 56 can regulate flow of the fluid 42 through the interior space 30 of both the first and second rack housings 28.

It should be appreciated that the cooling system 38 can define reverse flow through the first and second interior spaces 30 and 30' as desired. For instance, the cooling system 38 illustrated in FIG. 8 can include a second conduit 40 whose first heat exchanger region is disposed in the second interior space 30 of the second housing 28, and whose second heat exchanger region, which is disposed downstream with respect to the first heat exchanger region, is disposed in the first interior space 30 of the first housing 28. Thus, the fluid of the first conduit 40 is coolest when disposed in the first interior space 30, and the fluid of the second conduit is coolest when disposed in the second interior space 30, thereby providing for substantially equal heat transfer capacities in the first and second interior spaces 30 and 30' It should be further appreciated that the heat exchanger regions of either or both of the first and second conduits can include first and second regions of the type described above.

Referring to FIGS. 1-8 generally, a method of managing a rack system 26 disposed in a computing room 22 can include the steps of causing the fluid 42 to flow through the respective at least one conduit 40 that is at least partially disposed in the interior space 30 of the rack housing 28, the fluid 42 having a temperature greater that of ambient air in the interior space 30 of the rack housing 28. The method can include the steps of transferring heat from air in the rack housing 28 to the fluid 42 so as to produce cooled air, and drawing the cooled air from the interior space 30 of the rack housing 28 into the air intakes 39a of each of the respective computing devices 34. The method can further include the step of exhausting warm air from the air outlet 39b of each of the respective computing devices 34, the warm air having a temperature greater than that of the cooled air. The method can thus include the step of transferring heat from the warm air to the fluid 42.

The drawing step can further include the step of creating an airflow path in the rack housing 28 from each of the air intakes 39a that causing at least some of the air being drawn to flow past the conduit 40 prior to being drawn into the air intakes 39a. The exhausting step can further include the step creating an airflow path in the rack housing 28 from each of the air outlets 39b that causes at least some of the warm air to flow past the conduit 40, for instance the at least one heat exchanging region 40c. The drawing step can further include the step of creating an airflow path in the rack housing 28 from each of the air intakes 39a that causes at least some of the air being drawn to flow past the conduit 40, for instance the at least one heat exchanging region 40c, prior to being drawn into the air intakes 39a.

The fluid has a fluid temperature and flows through the conduit 40 at a fluid flow rate, and the method can further include the steps of measuring a difference in the fluid temperature between a first location of the conduit 40 and a second location of the conduit 40 that is disposed downstream of the first location with respect to fluid flow, decreasing the fluid flow rate through the conduit 40 when the difference is below a threshold value, and increasing the fluid flow rate through the conduit 40 when the difference is above a threshold value. The decreasing and increasing steps can each further include the step of actuating the valve 58 in the conduit 40.

The fluid can be configured as water, and the causing step can further comprises the steps of receiving the water in the conduit 40 from the water intake manifold 47, and removing the water out the interior space 30 after heat has transferred from air in the rack housing to the water. The method can further include the step of opening the access door 44 into the rack housing 28 so as to access at least one of the computing devices 34. The opening step can cause the interior space 30 of the rack housing 28 to be placed in temporary air flow communication with the computing room 22. The method can further include the step of closing the access door 44 so as to seal the rack housing 28 with respect to air flow both from the interior space 30 into the computing room 22 and from the computing room 22 into the interior space 30.

It should be noted that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. A data center comprising:
   at least one computing room;
   at least one rack system disposed in the at least one computing room, the at least one rack system including 1) a rack housing that encapsulates an interior space of the at least one rack system so as to seal the interior space of the at least one rack system with respect to airflow in and out of the interior space, the rack housing including an access door that is continuously solid along its entirety and is movable between an open position that provides access to the interior space and a closed position, and 2) a plurality of computing devices mounted to the rack in the interior space, wherein the plurality of computing devices each defines an air intake, an air outlet, and a fan that draws air from the sealed interior space of the rack housing through the air intake and out through the air outlet, wherein heat is dissipated from electrical components of each of the plurality of computing devices into the interior space of the rack housing; and
   a cooling system including a conduit that extends through the rack housing into the interior space, the cooling system further including a fluid that flows through the conduit and a heat exchanger disposed in the rack housing between the computing devices, wherein heat is transferred by the heat exchanger from air in the interior space to the fluid to produce cooled air in the rack housing that is drawn into the air intakes of the plurality of computing devices, and the fluid transports the transferred heat out of the rack housing, wherein movement of the door from the open position to the closed position causes the rack housing to seal the interior space with respect to airflow in and out of the interior space when the fan of each of the computing devices is drawing air from the interior space into the air intakes and out the air outlets.

2. The data center as recited in claim 1, wherein the access door is at a front end of the rack housing, the rack housing defines a rear end opposite the front end, the conduit defines a fluid intake, a fluid outlet, and a heat exchanger region disposed between the fluid intake and the fluid outlet, and the heat exchanger region is disposed in the rack housing between the computing devices and at least one of the front door and the rear wall.

3. The data center as recited in claim 1, wherein the cooling system is a closed system wherein the fluid intake is in fluid communication with the fluid outlet, such that the fluid flows through a heat rejection apparatus between the fluid outlet and the fluid intake.

4. The data center as recited in claim 1, wherein the fluid has a fluid temperature and flows through the conduit at a fluid flow rate, and the conduit comprises a first temperature sensor configured to measure the fluid temperature at a first location and a second temperature sensor configured to measure the fluid temperature at a second location that is disposed downstream of the first location, and the cooling system 1) increases the fluid flow rate through the conduit when a difference between the fluid temperature at the first and second locations is greater than a threshold value, and 2) decreases the fluid flow rate through the conduit when the difference between the fluid temperature at the first and second locations is less than a threshold value.

5. The rack system as recited in claim 1, wherein the at least one rack system comprises first and second rack systems disposed in the computing room, and the conduit extends from the rack housing of the first rack system through the rack housing of the second rack system, into the interior space of the rack housing of the second rack system, and out of the rack housing of the second rack system, such that heat is transferred from air in the interior space of the second rack system to the fluid to produce cooled air in the rack housing of the second rack system that is drawn into the air intakes of the plurality of computing devices of the second rack system, and the fluid transports the transferred heat out of the rack housing of the second rack system.

6. A rack system comprising:
a rack housing defining an interior space, the interior space having a front end and a rear end opposite the front end, the rack housing including an access door that defines the front end, the access door movable between an open position that provides access to the interior space and a closed position;
a rack supported by the rack housing in the interior space, the rack defining a plurality of bays, the bays sized to receive respective ones of a plurality of computing devices that each defines an air intake, an air outlet, and a fan that draws air that is sealed inside the interior space through the air intake and out through the air outlet, such that heat is dissipated from electrical components of each of the plurality of computing devices into the interior space of the rack housing; and
at least one conduit disposed in the rack housing, the at least one conduit defining at least one heat exchanger region that is disposed in the interior space and is configured to retain a fluid that flows therethrough so as to transfer heat from the air in the interior space to the fluid wherein the heat exchanger region is disposed in the rack housing between the computing devices,
wherein the rack housing is configured to seal the interior space when 1) the door is in the closed position, and 2) the fans of the computing devices draw air through the intakes and out through the outlets.

7. The rack system as recited in claim 6, wherein the fluid is a liquid.

8. The rack system as recited in claim 7, wherein the at least one heat exchanger region is disposed at a location adjacent the bays.

9. The rack system as recited in claim 6, wherein the at least one heat exchanger region is disposed at least at one of the front end of the interior space and the rear end of the interior space.

10. The rack system as recited in claim 6, wherein the at least one heat exchanger region comprises a first heat exchanger region and a second heat exchanger region that support fluid flow in opposite directions with respect to each other.

11. The rack system as recited in claim 6, wherein fans of the plurality of computing devices draw air along respective air intake paths through the air intakes, and the at least a portion of the conduit is disposed between the air intakes and the rack housing so as to be positioned in the respective air intake paths.

12. The rack system as recited in claim 6, wherein the fans of the plurality of computing devices exhaust air out the air outlet along respective air exhaust paths, and the at least a portion of the conduit is disposed between the air outlets and the rack housing so as to be positioned in the respective air exhaust path.

13. The rack system as recited in claim 6, wherein 1) the fans of the plurality of computing devices draw air along respective air intake paths through the air intakes, and exhaust air out the air outlets along respective air exhaust paths, 2) the at least a portion of the conduit defines a first region disposed between the air intakes and the rack housing so as to be positioned in the respective air intake paths, and 3) the at least a portion of the conduit defines a second region disposed between the air outlets and the rack housing so as to be positioned in the respective air exhaust path.

14. The rack system as recited in claim 6, further comprising a cooling system including a first temperature sensor configured to measure fluid temperature in the conduit at a first location, and a second temperature sensor configured to measure fluid temperature in the conduit at a second location that is disposed downstream of the first location, and a flow regulator configured to regulate a flow rate of the fluid within the conduit, wherein the cooling system 1) increases the fluid flow rate through the conduit when a difference between the fluid temperature at the first and second locations is greater a threshold value, and 2) decreases the fluid flow rate through the conduit when the difference between the fluid temperature at the first and second locations is less than a threshold value.

15. The rack system as recited in claim 6, further comprising a cooling system including a controller configured to 1) receive temperature signals from at least one of the computing devices that indicates a temperature of the at least one of the computing devices, and 2) provide an indication if the temperature of the at least one of the computing devices is greater than a predetermined threshold.

16. The rack system as recited in claim 6, wherein the fans of the computing devices are the only fans in the interior space.

17. A data center comprising:
the rack system as recited in claim 6; and
a second rack system including:
a second rack housing defining a second interior space, the second interior space having a second front end and a second rear end opposite the second front end, the second rack housing including a second access door that defines the second front end, the second access door movable between an open position that provides access to the second interior space and a closed position; and
a second rack supported by the second rack housing in the second interior space, the second rack defining a second plurality of bays, the second plurality of bays sized to receive respective ones of a second plurality of computing devices that each defines a second air intake, a second air outlet, and a second fan that draws air that is sealed inside the second interior space through the second air intake and out through second the air outlet, such that heat is dissipated from electrical components of each of the second plurality of computing devices into the second interior space of the second rack housing,
wherein the second rack housing is configured to seal the second interior space when 1) the second door is in the closed position, 2) the second fans of the second computing devices draw air through the second intakes and out through the second outlets, and 3) no other air movers located in the second interior space and outside the second computing devices direct air flow in the interior space, and
wherein at least one conduit further extends into the second rack housing, the at least one conduit defining at least one heat exchanger region that is disposed in the second interior space and is configured to retain a fluid that flows therethrough so as to transfer heat from the second interior space to the fluid.

18. A method of managing a rack system that is disposed in a computing room, the rack system including a rack housing, a rack supported by the rack housing in an interior space of the rack housing that is sealed by the rack housing with respect to airflow in and out of the interior space, computing devices mounted to the rack within the interior space of the rack housing, and the computing devices each including an air intake, an air outlet, and a fan that draws air from the sealed interior space of the rack housing through the air intake and out through the air outlet, the method comprising the steps of:
causing a fluid to flow through a conduit that is at least partially disposed in the interior space of the rack housing, the fluid having a temperature less than that of ambient air in the rack housing;
transferring heat from air in the rack housing to the fluid so as to produce cooled air through a heat exchanger disposed in the rack housing between the computing devices;
drawing the cooled air from the sealed interior space of the rack housing into air intakes of each of the respective computing devices;
exhausting warm air from an air outlet of each of the respective computing devices, the warm air having a temperature greater than that of the cooled air; and
maintaining the seal of the interior space by the rack housing during the drawing and exhausting steps without inducing any airflow in the interior space beyond the drawing and exhausting steps.

19. The method as recited in claim 18, further comprising the step of transferring heat from the warm air to the fluid.

20. The method as recited in claim 18, wherein the drawing step further comprises the step of creating an airflow path in the rack housing from each of the air intakes that causing at least some of the air being drawn to flow past the conduit prior to being drawn into the air intakes.

21. The method as recited in claim 18, wherein the exhausting step further comprises the step creating an airflow path in the rack housing from each of the air outlets that causes at least some of the warm air to flow past the conduit.

22. The method as recited in claim 21, wherein the drawing step further comprises the step of creating the airflow path in the rack housing from each of the air intakes that causes at least some of the air being drawn to flow past the conduit prior to being drawn into the air intakes.

23. The method as recited in claim 18, wherein the fluid has a fluid temperature and flows through the conduit at a fluid flow rate, the method further comprising the steps of:
measuring a difference in the fluid temperature between a first location and a second location that is disposed downstream of the first location with respect to the fluid flow;
decreasing the fluid flow rate through the conduit when the difference is below a threshold value; and
increasing the fluid flow rate through the conduit when the difference is above a threshold value.

24. The method as recited in claim 23, wherein the decreasing and increasing steps each further comprises the step of actuating a valve in the conduit.

25. The method as recited in claim 18, wherein the fluid comprises water, and the causing step further comprises the steps of receiving the water in the conduit from a water manifold, and removing the water out the interior space after heat has transferred from air in the rack housing to the water.

26. The method as recited in claim 18, further comprising the steps of 1) opening an access door into the rack housing so as to access at least one of the computing devices, the opening step causing the interior space of the rack housing to be placed in temporary air flow communication with the computing room, and 2) closing the access door so as to seal the rack housing with respect to air flow both from the interior space into the computing room and from the computing room into the interior space.

27. A method of constructing a rack system, the method comprising the steps of:
constructing a rack housing in an ambient environment, the rack housing including a door that is movable between an open position to provide access to the interior, and a closed position, wherein the door is continuously solid such that moving the door to the closed position causes the rack housing to seal an interior space of the rack housing;
supporting a rack in the rack housing, the rack configured to support a plurality of computing devices that each include an air intake, an air outlet, and a fan that is configured to draw air that is sealed in the rack housing through the air intake and out through the air outlet, wherein heat is dissipated from electrical components of each of the plurality of computing devices into the interior space of the rack housing;

supporting at least one conduit in the rack housing such that the conduit enters the interior space at a first location of the rack housing, extends in the interior space, and exits the interior space at a second location of the rack housing that is different than the first location; and placing the at least one conduit in fluid communication with a fluid source, such that fluid can flow from the fluid source through the conduit and through a heat exchanger disposed in the rack housing between the computing devices.

28. The method as recited in claim 27, further comprising placing the conduit in communication with a drain such that fluid that has flown from the fluid source through the conduit exits the conduit into the drain.

\* \* \* \* \*